United States Patent
Hamada

(10) Patent No.: US 8,235,574 B2
(45) Date of Patent: Aug. 7, 2012

(54) LIGHT-EMITTING DEVICE, ILLUMINATING DEVICE COMPRISING SAME, AND LIQUID CRYSTAL DISPLAY

(75) Inventor: Tetsuya Hamada, Matsusaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 323 days.

(21) Appl. No.: 12/281,342

(22) PCT Filed: Nov. 2, 2006

(86) PCT No.: PCT/JP2006/321937
§ 371 (c)(1),
(2), (4) Date: Sep. 2, 2008

(87) PCT Pub. No.: WO2007/116555
PCT Pub. Date: Oct. 18, 2007

(65) Prior Publication Data
US 2009/0052165 A1    Feb. 26, 2009

(30) Foreign Application Priority Data
Apr. 7, 2006    (JP) .................................. 2006-106177

(51) Int. Cl.
*F21V 7/04* (2006.01)
(52) U.S. Cl. ........................................ 362/631; 362/612

(58) Field of Classification Search ................. 362/97.2, 362/97.3, 249.02, 612, 630–631, 800; 349/69
See application file for complete search history.

(56) References Cited

U.S. PATENT DOCUMENTS

| | | | |
|---|---|---|---|
| 6,697,130 B2 * | 2/2004 | Weindorf et al. | 349/65 |
| 2002/0180923 A1 | 12/2002 | Aoyagi et al. | |
| 2005/0141244 A1 | 6/2005 | Hamada et al. | |

FOREIGN PATENT DOCUMENTS

| | | |
|---|---|---|
| JP | 2002-231033 A | 8/2002 |
| JP | 2003-092020 A | 3/2003 |
| JP | 2004-021147 A | 1/2004 |

OTHER PUBLICATIONS

Official Communication issued in International Patent Application No. PCT/JP2006/321937, mailed on Dec. 26, 2006.

* cited by examiner

*Primary Examiner* — Jason Moon Han
(74) *Attorney, Agent, or Firm* — Keating & Bennett, LLP

(57) ABSTRACT

In a light emitting device, LEDs are arranged in a line on a film which is provided with a conductor. The conductor connects the LEDs to a connector. The film is bent at a division line between a region where the LEDs are arranged and a region where the conductor is formed, and disposed on the inner surface of a reflector. A reflective material is arranged on a surface of the conductor region which faces to the LEDs.

12 Claims, 5 Drawing Sheets

LIGHT-EMITTING DEVICE, ILLUMINATING DEVICE COMPRISING SAME, AND LIQUID CRYSTAL DISPLAY

BACKGROUND OF THE INVENTION

1. Field of the Invention

The present invention relates to an elongated light-emitting device including an LED, an illuminating device using the elongated light-emitting device as a backlight, and a liquid crystal display including the illuminating device.

2. Description of the Related Art

Recently, display devices using a liquid crystal panel, which is thinner than a CRT (cathode ray tube), have been widely used. The liquid crystal panel, not emitting light itself, displays an image by using external light or by being irradiated with light from an illuminating device.

Examples of illuminating devices for use in liquid crystal displays include the sidelight type backlight proposed in JP-A-2004-21147 (pages 4 and 5, FIG. 1). This sidelight type backlight is used by being placed behind a liquid crystal panel, and is formed of a flat plate called a light guide plate formed of acrylic resin and a light-emitting device that is placed along a side surface of the light guide plate. The light-emitting device is formed of LEDs (light emitting diodes) arranged in line to serve as a light source. Light emitted from the light-emitting device is reflected inside the light guide plate to propagate through it; the light is then emitted from a light emitting surface formed on the front surface of the light guide plate to illuminate the liquid crystal panel.

A description will be given of a light-emitting device incorporated in a sidelight type backlight with reference to FIGS. 12 to 16. FIG. 12 is a diagram schematically showing the structure of a typical conventional light-emitting device. As shown in FIG. 12, a light-emitting device 140 has LEDs 143 arranged in line inside a reflector 142. A reflective material is formed on an inner surface of the reflector 142, and an opening is formed at a side of the reflector 142 at which the light emitting side of the LEDs 143 is located. As shown in FIG. 13, the LEDs 143 are arranged on a film 141 and connected in series to one another by a conductor 144 provided in the film 141. The conductor 144 is provided such that both ends thereof reach an end portion 141a that extends outward from the reflector 142 so as to be connected to an LED driver (not shown) that is provided outside the light emitting device 140. This film 141 is formed of two layers of films, and the conductor 144 is arranged between the two layers of films. The pattern of the conductor 144 and the region necessary for it is determined according to specifications for current capacity and voltage. Light emitted from the LEDs 143 directly enters a light guide plate (not shown), or enters the light guide plate after it is reflected at the inner surface of the reflector 142.

In the case where connection to the LED driver is achieved by using a wire harness or an FFC (flexible flat cable), instead of the end portion 141a extending outward from the reflector 142, a connector 145 as shown in FIG. 14 is provided so as to be connected to the conductor 144.

As shown in FIG. 15, in the case where a plurality of groups of LEDs are provided so as to lower the voltage to be applied, the LEDs in each group being connected in series to one another, both ends of the conductor 144 of each LED group connecting the LEDs therein need to be extended to the end portion 141a, and accordingly, a larger region is necessary. Furthermore, when a connector is provided, this region becomes even larger.

In the case where, as the LEDs 143, RGB-LEDs that are capable of emitting light of three colors of R (red), G (green), and B (blue), are used, three times larger amount of conductors are necessary compared with the case where an LED having one chip is used, because each one of the LEDs 143 is provided with terminals corresponding to the chips of the three colors and each of the terminals needs the conductor 144. FIG. 16 shows the film 141 used in the case where RGB-LEDs are used and two groups of LEDs that are connected in series to one another are provided. In this case, the region necessary for the conductor 144 increases, and it further increases if a connector is provided.

Today, thinner illuminating devices have been required to achieve thinner liquid crystal displays; in a sidelight type backlight, it is necessary to reduce the thickness of a light-emitting device provided along a side surface of a light guide plate. However, the height ("h" in FIG. 12) of the light-emitting device 140 is determined according to the region necessary for the conductor 144 in the film 141 and the region necessary to arrange the LEDs 143, and hence, the height of the light-emitting device 140 is increased as the pattern of the conductor 144 becomes more complicated and the conductor 144 requires a larger region.

SUMMARY OF THE INVENTION

In order to overcome the problems described above, preferred embodiments of the present invention provide a light-emitting device having a low height with which a thinner backlight and a thinner liquid crystal display can be achieved.

According to a preferred embodiment of the present invention, a light-emitting device includes: a film; LEDs arranged in line on the film; and a conductor arranged on the film to connect the LEDs to an LED driver that drives the LEDs. The film is preferably formed of an LED mounting region on which the LEDs are arranged and a conductor region in which the conductor is provided, and the film is bent along a division line between the LED mounting region and the conductor region.

According to another preferred embodiment of the present invention, an illuminating device includes: the light-emitting device having the above structure; and a light guide plate through which light emitted from the light-emitting device propagates to be emitted from a light emitting surface of the light guide plate.

According to another preferred embodiment of the present invention, a liquid crystal display includes: a liquid crystal panel; and the illuminating device having the above described structure. Here, the illuminating device is arranged so as to irradiate the liquid crystal panel from behind with the light emitted from the light emitting surface of the light guide plate.

According to various preferred embodiments of the present invention, the height of a light-emitting device can be kept to a minimum necessary to accommodate LEDs regardless of how large the region necessary for a conductor is, and this makes it possible to reduce the thickness of an illuminating device that incorporates this light emitting device, and to reduce the thickness of a liquid crystal display.

According to various preferred embodiments of the present invention, by bending a conductor region of a film away from an LED, a more flexible arrangement of a terminal and a connector for achieving connection to the outside, a more flexible illuminating device, and a more flexible liquid crystal display, all can be achieved.

According to various preferred embodiments of the present invention, by providing two LED mounting regions and two lines of LEDs, a light-emitting device with improved brightness can be realized while keeping the height of the light-emitting device to a minimum necessary to accommodate two LEDs in the height direction. In addition, by staggering the LEDs of one LED mounting region in an arrangement direction with respect to the LEDs of the other LED mounting region, light emitted from the light-emitting device can be improved in evenness.

According to another preferred embodiment of the present invention, a light-emitting device can emit light emitted by LEDs more effectively by forming a reflective material on a conductor region at a surface thereof that faces LEDs.

According to a further preferred embodiment of the present invention, a light-emitting device can be kept in a stable condition by providing a support member for supporting a film, and the film can be easily placed on the support member by forming the support member of a plurality of members.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

First Preferred Embodiment

Figure 1:
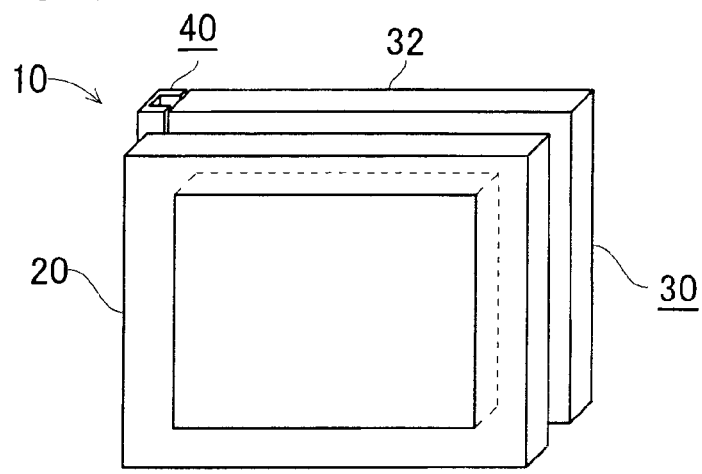
FIG. 1 is a diagram schematically showing the structure of a liquid crystal display of a first preferred embodiment of the present invention.
Figure 4:
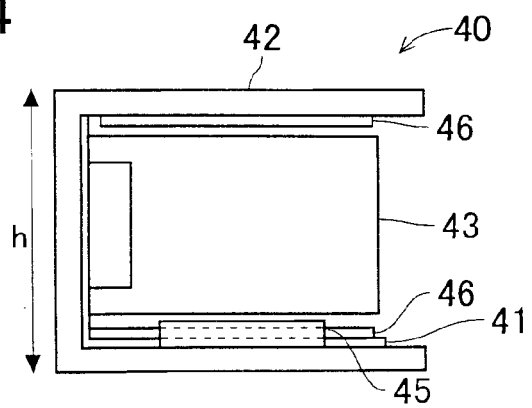
FIG. 4 is a front view showing a light-emitting device of the first preferred embodiment of the present invention.
Figure 5:
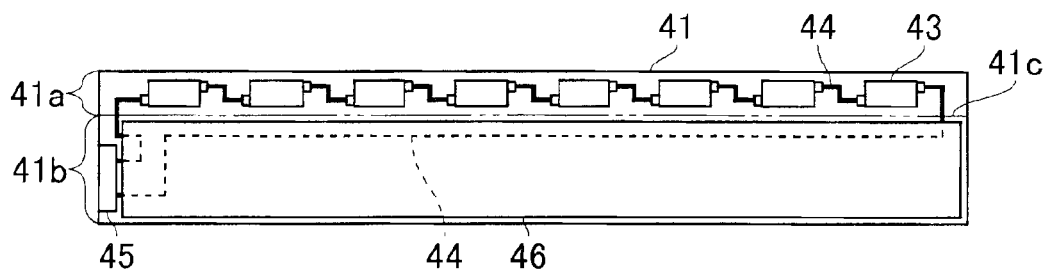
FIG. 5 is a developed view showing a film of the first preferred embodiment of the present invention.

A description will be given of a first preferred embodiment of the present invention with reference to the accompanying drawings. FIG. 1 is a diagram schematically showing the structure of a liquid crystal display of the first preferred embodiment, FIG. 2 is a plan view showing a backlight of the first preferred embodiment, FIG. 3 is a front view showing the backlight, FIG. 4 is a front view showing a light-emitting device of the first preferred embodiment, and FIG. 5 is a developed view showing a film of the first preferred embodiment of the present invention.

As shown in FIG. 1, the liquid crystal display 10 is provided with a liquid crystal panel 20 and a backlight 30 that serves as an illuminating device. The liquid crystal panel 20 is provided with a TFT substrate, a counter substrate, and liquid crystal held between the TFT substrate and the counter substrate. The liquid crystal panel 20 displays an image by controlling the alignment of the liquid crystal by applying a voltage between the two substrates. The backlight 30 is disposed behind the liquid crystal panel 20 and irradiates an image displayed on the liquid crystal panel 20 with white light emitted from its light emitting surface.

Figure 2:
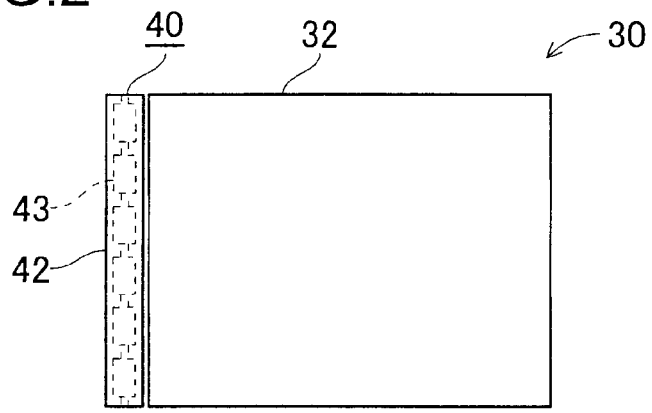
FIG. 2 is a plan view showing a backlight of the first preferred embodiment of the present invention.
Figure 3:
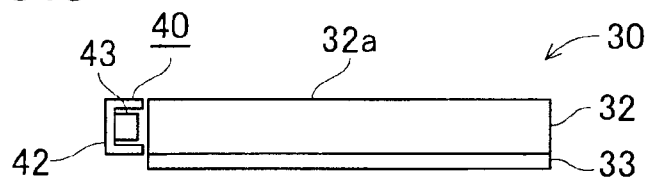
FIG. 3 is a front view showing the backlight of the first preferred embodiment of the present invention.

As shown in FIGS. 2 and 3, the backlight 30 is provided with the light-emitting device 40, a light guide plate 32, and a reflection plate 33. The light-emitting device 40 is provided with a reflector 42 and LEDs 43 that are arranged inside the reflector 42, and is disposed such that light emitted from the LEDs 43 enters a side surface of the light guide plate 32. The reflection plate 33 is disposed so as to face a surface of the light guide plate 32 that is opposite to a surface thereof that faces the liquid crystal panel 20.

The light emitted from the LEDs 43 of the light-emitting device 40 directly enters the light guide plate 32, or enters the light guide plate 32 after it is reflected by the inner surface of the reflector 42; then the light propagates through the light guide plate 32 to be emitted as white light from a light emitting surface 32a that faces the liquid crystal panel 20. The portion of the light that is emitted toward the reflection plate 33 is reflected by the reflection plate 33 and reenters the light guide plate 32 to propagate through the light guide plate 32.

In this preferred embodiment, the LEDs 43 are arranged on the film 41 as shown in FIGS. 4 and 5. The film 41 may be, for example, an FPC (flexible printed circuit) formed of two films between which is arranged a conductor 44 made of foil of metal such as copper. By this conductor 44, the LEDs 43 are connected in series to one another, and both ends of the conductor 44 are connected to a connector 45. Here, although the conductor 44 is actually invisible from outside the film 41, it is indicated by a solid line in the figure except for the portion thereof concealed by a later-described reflective material 46, which is indicated by a broken line. To the connector 45, a wire harness, an FFC (flexible flat cable), or the like is connected, and thereby the LEDs 43 are connected to an LED driver (not shown) that drives the LEDs 43.

The film 41 is formed of an LED mounting region 41a where the LEDs are arranged and a conductor region 41b where the conductor 44 and the connector 45 are provided; the film 41 is bent along a division line 41c between these regions, and is disposed on the inner surface of the reflector 42. The division line 41c is indicated by a chain double-dashed line in the figure. The film 41 can be firmly fitted to the inner surface of the reflector 42 with a double-stick tape, an adhesive, or the like. The reflective material 46 is formed on the conductor region 41b at a surface thereof that faces to the LEDs 43. The reflective material 46 may be a glossy tape, a white tape, or paint, may be plated on the film 41, or may be metal directly deposited on the film 41.

In this preferred embodiment, the reflector 42 serves both as a support member for supporting the LEDs 43 and as a reflection member for reflecting light emitted from the LEDs 43, and the reflective material 46 is formed on a portion of the inner surface of the reflector 42 that is not covered by the film 41. The reflective material 46 may be a glossy tape, a white tape, or paint, or may be metal directly deposited on the film 41.

With this structure, regardless of how large the region of the film 41 necessary for the conductor 44 is, it is possible to keep the height (indicated by "h" in FIG. 4) of the reflector 42 to a minimum necessary to accommodate the LEDs 43, and as a result, the thickness of the backlight 30 and of the liquid crystal display 10 can be reduced. Thus, even in the case where, as shown in the conventional example, there are provided a plurality of LED groups in which the LEDs 43 are connected in series to one another, or in the case where RGB-LEDs are used as the LEDs 43, the conductor 44 can be placed without any problem while keeping the height of the reflector 42 low.

Figure 6:
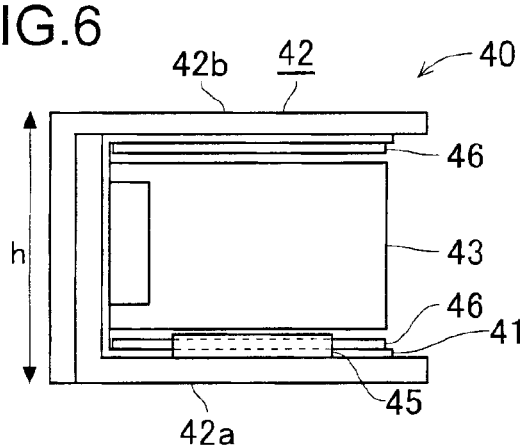
FIG. 6 is a front view showing another example of the light-emitting device of the first preferred embodiment of the present invention.
Figure 7:
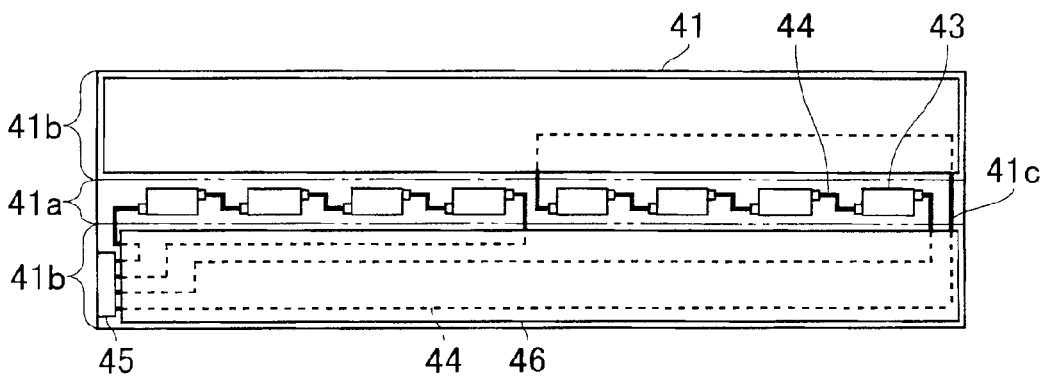
FIG. 7 is a developed view showing another example of the film of the first preferred embodiment of the present invention.

In this preferred embodiment, the conductor region 41b may be formed on both sides of the LED mounting region 41a as shown in FIGS. 6 and 7. FIG. 7 shows the case where there are provided two LED groups in which the LEDs 43 are connected in series to one another, and the conductor 44 is provided in each conductor region 41b. The reflective material 45 is formed in each conductor region 41b. This makes it possible to place the conductor 44 without any problem even when it is complicated. Incidentally, in this case, there is no need to form a reflective material directly on the inner surface of the reflector 42.

As shown in FIG. 6, the reflector 42 may be formed of a plurality of members. In the case shown in FIG. 6, the reflector 42 is formed of members 42a and 42b which are preferably substantially L-shaped in section; they have the same length in the arrangement direction of the LEDs 43, and are each formed of two portions, that is, one located on a lateral side with respect to an opening and the other located at a rear side with respect to the opening. In this case, the reflector 42 is fabricated in the following manner: first, on the member 42a, which is to be located inward with respect to the member 42b, the LED mounting region 41a and one of the conductor regions 41b are arranged; then, the member 42b with a double-stick tape or an adhesive applied to the inner surface thereof is fitted to the member 42a; then, the other one of the conductor regions is arranged on the inner surface of the member 42b. In this way, the film 41 can be easily fitted on the reflector 42. Incidentally, in the case where the film 41 has only one conductor region 41b, which is to be arranged on the member 42a before the member 42b is fitted thereto, the film 41 can be fitted on the reflector 42 more easily.

Figure 8:
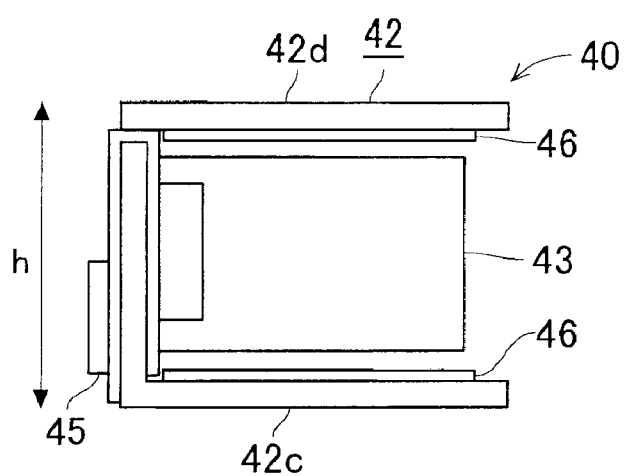
FIG. 8 is a front view showing another example of the light-emitting device the first preferred embodiment of the present invention.

In this preferred embodiment, the conductor region 41b of the film 41 may be located outside of the reflector 42. As shown in FIG. 8, the LED mounting region 41a of the film 41 is located on the inner surface of the reflector 42, and the conductor region 41b is located on an outer surface of the reflector 42 so as to face the LED mounting region 41a with the reflector 42 therebetween. The reflector 42 is preferably formed of a member 42c which preferably is substantially L-shaped in section and a plate-shaped member 42d; the member 42c is formed of a portion located at a lateral side with respect to an opening and a portion located at a rear side with respect to the opening. The members 42c and 42d are connected to each other along edges thereof in the longitudinal direction, with a gap provided therebetween so as to allow the film 41 to be inserted therethrough. The light-emitting device 40 can be fabricated by fitting the member 42d to the member 42c after the film 41 is fitted on the member 42c. In this case, no reflective material is formed on the conductor region 41b; instead, the reflective material 46 is formed on a portion of the inner surface of the reflector 42 that faces to the LEDs 43.

This structure makes it possible to keep the height of the reflector 42 ("h" in FIG. 8) to a minimum necessary to accommodate the LEDs 43, and thereby to reduce the thickness of the backlight 30. Furthermore, the connector 45 is disposed outside the reflector 42 in this structure, and this allows more flexibility in designing the backlight 30 and the liquid crystal display 10. The reflector 42 shown in FIG. 8 also accepts the film 41 having the conductor regions 41a formed on both sides of the LED mounting region 41a. In this case, it is preferable that one of the conductor regions 41b having the connector 45 be disposed outside the reflector 42 and the other one of the conductor regions 41b be disposed on the inner surface of the reflector 42.

Second Preferred Embodiment

Figure 9:
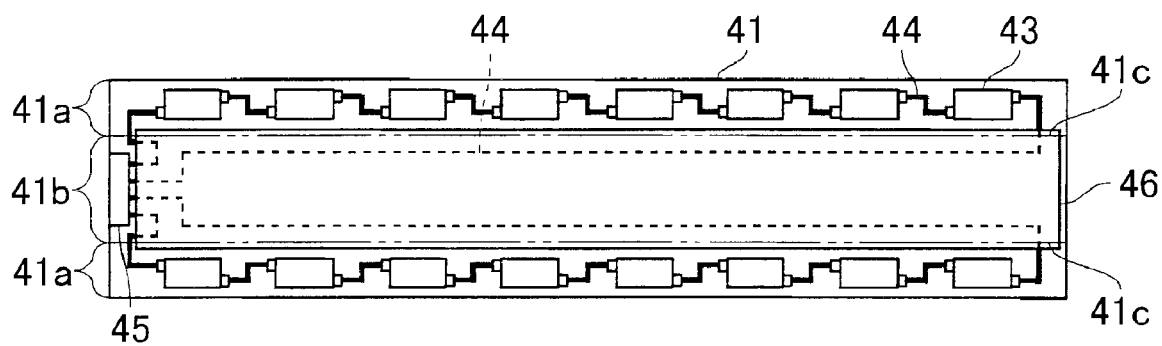
FIG. 9 is a developed view showing a film of a second preferred embodiment of the present invention.
Figure 10:
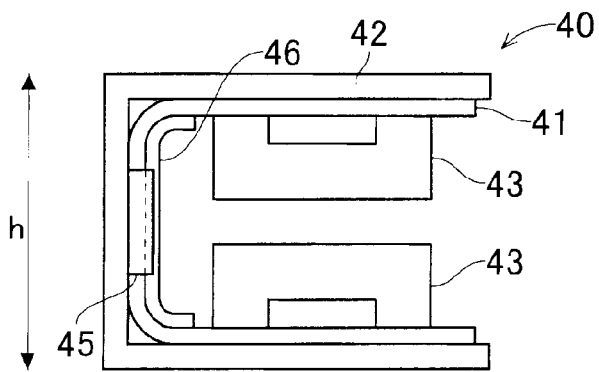
FIG. 10 is a front view showing a light-emitting device of the second preferred embodiment of the present invention.

Next, a description will be given of a second preferred embodiment of the present invention with reference to the accompanying drawings. FIG. 9 is a developed view showing a film of the second preferred embodiment, and FIG. 10 is a front view of a light-emitting device of the second preferred embodiment. The second preferred embodiment has the same structure as the first preferred embodiment except that the LEDs are arranged on the film in a different manner, and the parts and components that are substantially the same as those in the first preferred embodiment are identified with the same reference numerals.

As shown in FIG. 9, a film 41 of this preferred embodiment is formed of a conductor region 41b and two LED mounting regions 41a between which the conductor region 41b is sandwiched. A plurality of LEDs 43, which are connected to one another by a conductor 44, are arranged on each of the LED mounting regions 41a. The conductors 44, no matter which one of the LED mounting regions 41a they are connected to, are arranged in the conductor region 41b, and connected to a connector 45 located at an end of the conductor region 41b. On the conductor region 41b, a reflective material 46 is formed.

The film 41 having the above-described structure is bent along division lines 41c between the conductor region 41b and the LED mounting regions 41a, and is disposed on the inner surface of the reflector 42. The film being disposed inside the reflector 42, the LEDs 43 on both of the LED mounting regions 41a are arranged such that their light emitting surfaces are oriented toward an opening of the reflector 42.

With this structure, it is possible to keep the height of the reflector 42 ("h" in FIG. 10) to a minimum necessary to accommodate two LEDs 43 in the height direction, and thus to keep a backlight 30 thin. Furthermore, since the LEDs 43 are provided in two lines, the brightness of the backlight 30 can be improved.

Figure 11:
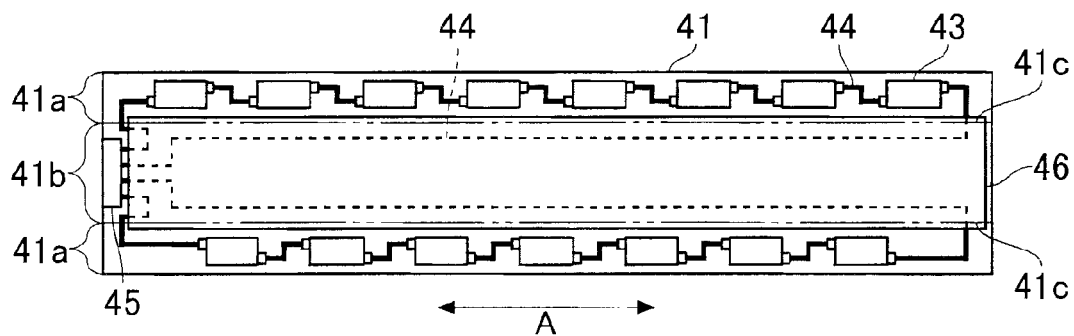
FIG. 11 is a developed view showing another example of the film of the second preferred embodiment of the present invention.
Figure 12:
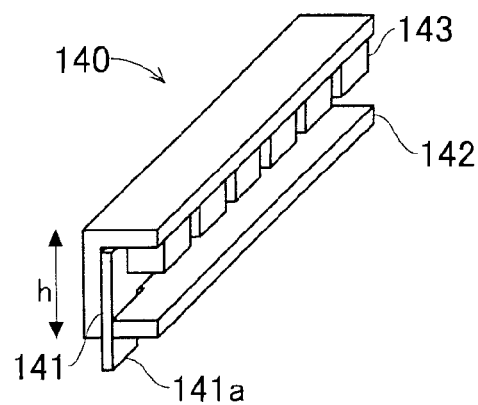
FIG. 12 is a diagram schematically showing the structure of a conventional light-emitting device.
Figure 13:
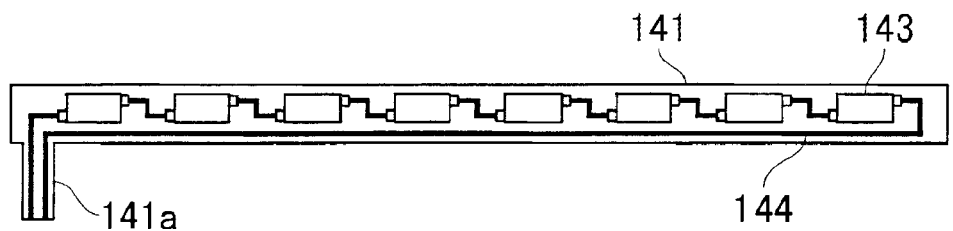
FIG. 13 is a front view showing a conventional film.
Figure 14:
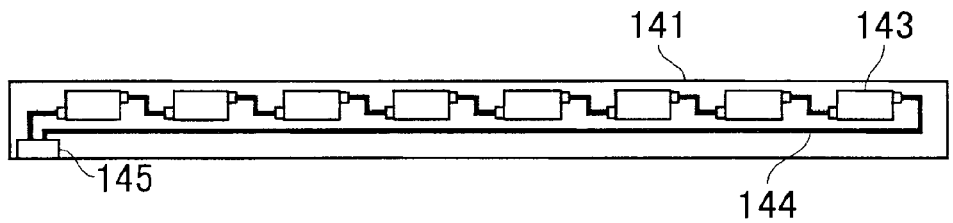
FIG. 14 is a front view showing another example of the conventional film.
Figure 15:
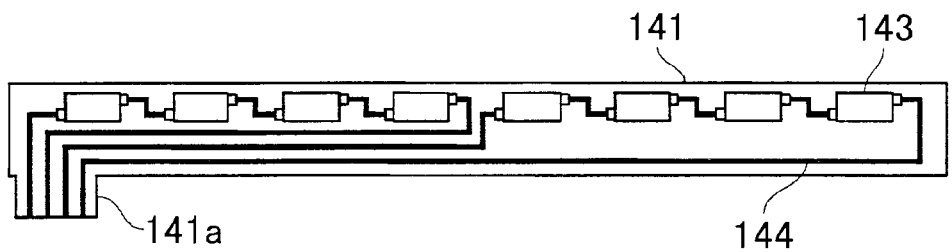
FIG. 15 is a front view showing another example of the conventional film.
Figure 16:
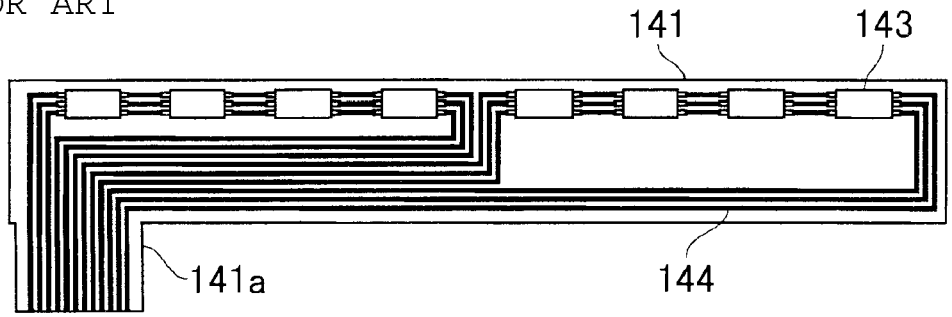
FIG. 16 is a front view showing another example of the conventional film.

In this preferred embodiment, as shown in FIG. 11, the LEDs 43 arranged on one of the LED mounting regions 41a may be staggered in the arrangement direction of the LEDs 43 (the direction "A" in FIG. 11) with respect to the LEDs 43 arranged on the other one of the LED mounting regions 41a. With this structure, when the LEDs are lit, dark zones generated between adjacent ones of the LEDs 43 arranged on one of the LED mounting regions 41a can be lit up by the light emitted from the LEDs 43 arranged on the other one of the LED mounting region 41*a*, and thereby the light emitted from the light-emitting device 40 to enter the light guide plate 32 can be improved in evenness.

In this preferred embodiment, the reflector 42 may also be formed of two members as shown in FIG. 6. This makes it easy to place the film 41 in the reflector 42.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A liquid crystal display, comprising:
a liquid crystal panel; and
a light emitting device, comprising:
a film bent to have a U-shape or an L-shape having at least two sides arranged perpendicularly or substantially perpendicularly to each other;
LEDs arranged in a line on the film;
a conductor including two ends being arranged on the film;
a connector arranged on one of the at least two sides of the film; and
a support member arranged to define a U-shape, the support member being arranged to support the film by being in direct contact with the at least two sides of the film, and the support member including an opening at a side thereof at which a light emitting side of the LED is located; wherein
the LEDs are connected to each other in series by the conductor, both of the two ends of the conductor are directly physically connected to the connector, and a wire harness or a flexible flat cable is directly physically connected to the connector;
the LEDs are connected via the connector to an LED driver that is arranged to drive the LEDs; and
the LEDs are arranged on the film at one of the at least two sides of the film, and the conductor is arranged on the film such that a portion of the conductor is arranged at another one of the at least two sides of the film.

2. The liquid crystal display of claim 1, wherein the conductor is bent toward the LEDs.

3. The liquid crystal display of claim 1, wherein there are at least two of the conductors and the at least two of the conductors are arranged on the film with the LEDs provided therebetween and at least one of the at least two of the conductors is bent toward the LEDs.

4. The liquid crystal display of claim 1, wherein some of the LEDs are provided in an additional line and the line of the LEDs and the additional line of the LEDs are arranged to sandwich the conductor therebetween, and the conductor is bent toward the LEDs of each of the line of the LEDs and the additional line of the LEDs.

5. The liquid crystal display of claim 4, wherein LEDs of a first one of the line of the LEDs and the additional line of the LEDs are staggered in an arrangement direction with respect to LEDs of a second one of the line of the LEDs and the additional line of the LEDs.

6. The liquid crystal display of claim 1, wherein a reflective material is arranged on the film at a surface thereof that faces the LEDs.

7. The liquid crystal display of claim 1, wherein the support member includes a plurality of members having a same length in a direction parallel to an arrangement direction of the LEDs.

8. The liquid crystal display of claim 1, wherein
a light guide plate through which light emitted from the light-emitting device propagates to be emitted from a light emitting surface of the light guide plate.

9. The liquid crystal display of claim 8, wherein
the illuminating device is arranged so as to irradiate the liquid crystal panel from behind with the light emitted from the light emitting surface of the light guide plate.

10. The liquid crystal display of claim 1, wherein reflective material is provided on both of two different sides of the U-shape defined by the support member such that the reflective material is arranged to face the LEDs.

11. The liquid crystal display of claim 1, wherein the support member is defined by a single monolithic member.

12. The liquid crystal display of claim 1, wherein the support member is defined by a plurality of separate members.

* * * * *